United States Patent
Smith

(10) Patent No.: US 7,095,288 B2
(45) Date of Patent: Aug. 22, 2006

(54) LOGIC SYSTEM WITH ADAPTIVE SUPPLY VOLTAGE CONTROL

(75) Inventor: Sterling Smith, HsinChu Hsien (TW)

(73) Assignee: MStar Semiconductor, Inc., (TW)

(*) Notice: Subject to any disclaimer, the term of this patent is extended or adjusted under 35 U.S.C. 154(b) by 392 days.

(21) Appl. No.: 10/624,548

(22) Filed: Jul. 23, 2003

(65) Prior Publication Data

US 2004/0130357 A1 Jul. 8, 2004

Related U.S. Application Data

(60) Provisional application No. 60/398,613, filed on Jul. 26, 2002.

(51) Int. Cl.
*H03B 5/04* (2006.01)
(52) U.S. Cl. .................... 331/74; 331/185; 331/186
(58) Field of Classification Search .............. 331/57, 331/74, 185, 186
See application file for complete search history.

(56) References Cited

U.S. PATENT DOCUMENTS 5,632,040 A * 5/1997 Nakajima .................... 713/322

FOREIGN PATENT DOCUMENTS

TW 485281 5/2002

OTHER PUBLICATIONS

Copy of Taiwanese Office Action dated Apr. 4, 2005.

* cited by examiner

*Primary Examiner*—David Mis
(74) *Attorney, Agent, or Firm*—Michael Bednarek; Pillsbury Winthrop Shaw Pittman LLP

(57) ABSTRACT

A logic system with adaptive supply voltage control comprising a logic circuit clocked by a clock signal from a clock generating circuit and a voltage conversion circuit for generating a dynamically regulated supply voltage for powering the logic circuit. A critical path delay of the logic circuit is designed to be equal to or shorter than a period of the clock signal. The voltage conversion circuit dynamically regulates the supply voltage of the logic circuit based on a bias voltage of the clock generating circuit. According to the invention, the power consumption is effectively minimized while ensuring the logic circuit to function correctly throughout all conditions.

23 Claims, 7 Drawing Sheets

SS : Slow Process
TT : Typical Process
FF : Fast Process

SS : Slow Process
TT : Typical Process
FF : Fast Process

LOGIC SYSTEM WITH ADAPTIVE SUPPLY VOLTAGE CONTROL

CROSS-REFERENCE TO RELATED APPLICATIONS

This application is based upon and claims the benefit of U.S. provisional application No. 60/398,613 filed Jul. 26, 2002, the contents of which are incorporated herein by reference.

BACKGROUND OF THE INVENTION

1. Field of the Invention

This invention relates to an adaptive supply voltage control technology for minimizing power consumption, particularly to a low power logic circuit with adaptive supply voltage control and an adaptive supply voltage control method for low power logic circuit.

2. Description of the Related Art

In conventional low power logic circuit design, lowering the power supply voltage of a circuit is generally known as the most effective way to reduce power dissipation, as the power consumption is proportional to the square of the supply voltage. Unfortunately, reducing the power supply voltage results in an undesired increase of the logic circuit delay. Although high supply voltage is not necessary during normal operation of a logic circuit, the supply voltage is usually set at a level which is high enough to guarantee that the circuit can work under all conditions. That is, the supply voltage is always determined for the worst case, where the speed becomes slower due to the variation of temperature, process shifts and aging, to assure the critical path of the logic circuit is fast enough to meet the critical path delay constraints. As such, this constant voltage setting results in excessive power consumption in most conditions.

In the field of logic circuit design, various adaptive power supply voltage regulation techniques have been proposed. In these proposals, to make the circuit more power efficient, power supply voltage is regulated to a lower level during normal use, while allowing for higher power supply voltage in situations where the circuit speed must be increased. For example, in the application of a portable computer, power supply voltage of a central processing unit is reduced as its clock frequency decreases, while the power supply voltage is set to a higher level as the clock frequency increases.

Recently, applications of low power logic circuits have increasingly broadened. In some specific applications, there is very little power available for the logic circuits. For these circuits, an adaptive supply voltage control technique is demanded to minimize the power consumption more effectively.

SUMMARY OF THE INVENTION

Therefore, an objective of the present invention is to provide a logic system with adaptive supply voltage control and an adaptive supply voltage control method for logic system, in which the supply voltage of the logic circuit is effectively controlled to minimize the power consumption.

Another objective of the present invention is to provide a logic system with adaptive supply voltage control and an adaptive supply voltage control method for logic system, in which the logic circuit is ensured to function correctly while the supply voltage of the logic circuit is lowered to a minimum level required.

To achieve the above objectives, the logic system with adaptive supply voltage control according to the present invention comprises a logic circuit and a voltage conversion circuit for generating a dynamically regulated supply voltage for powering the logic circuit. The logic circuit is clocked by a clock signal of a predetermined frequency received from a clock generating circuit. For the logic circuit to function properly, a critical path delay of the logic circuit must be equal to or shorter than a period of the clock signal. The voltage conversion circuit dynamically regulates the supply voltage of the logic circuit based on a bias voltage of the clock generating circuit.

Preferably, the period of the clock signal is designed slightly longer than the critical path delay of the logic circuit for safe operating margin under all expected operating conditions.

The bias voltage and/or operating frequency of the clock generating circuit changes if process shifts or temperature varies. In most cases the clock generating circuit must be maintained at a specified frequency, so a control mechanism for maintaining the frequency is required. There are numerous well-known methods for achieving this, such as a PLL (phase-locked loop). In a preferred embodiment of the invention, the clock generating circuit and the logic circuit are designed with elements having the same or similar delay characteristics, and the supply voltage of the logic circuit is dynamically regulated by the voltage conversion circuit to track a bias voltage of the clock generating circuit. Therefore, the supply voltage is reduced in most conditions and thus the power consumption is effectively minimized while assuring proper function of the logic circuit through all conditions.

In other embodiments of the invention, a DLL (delay-locked loop) or a delay reference matching circuit, for example, maybe used to approximately match the critical path delay of the logic circuit with the period of the clock signal.

BRIEF DESCRIPTION OF THE DRAWINGS

Objects and advantages of the present invention will be fully understood from the detailed description to follow taken in conjunction with the embodiments as illustrated in the accompanying drawings, wherein:

FIGS. 2(a) and 2(b) illustrate examples of the voltage/current control circuit for oscillator in the preferred embodiment of FIG. 1, in which FIG. 2(a) is a current control circuit and FIG. 2(b) is a voltage control circuit;

DETAILED DESCRIPTION OF THE PREFERRED EMBODIMENT

Figure 1:
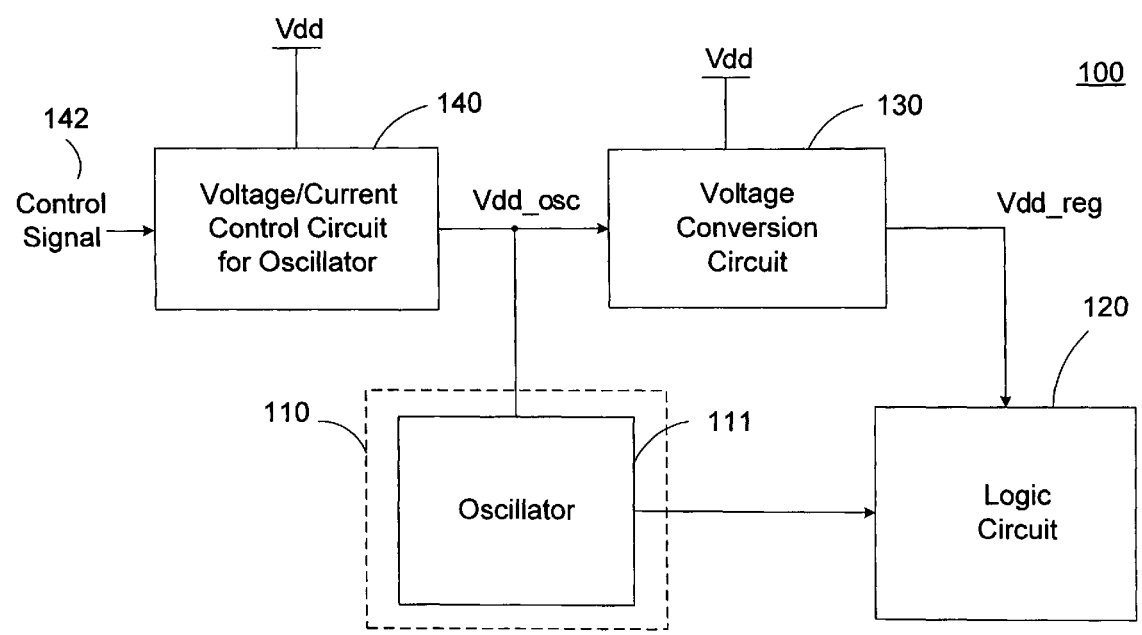
FIG. 1 depicts a schematic circuit diagram of a preferred embodiment of the logic system with adaptive supply voltage control according to the present invention.

Please refer to FIG. 1, which shows the schematic circuit diagram of a preferred embodiment of the logic system with adaptive supply voltage control according to the present invention. As shown, the logic system 100 mainly comprises a logic circuit 120 clocked by a clock signal from a clock generating circuit 110 and a voltage conversion circuit 130 for regulating the supply voltage of the logic circuit 120.

Figure 2A:
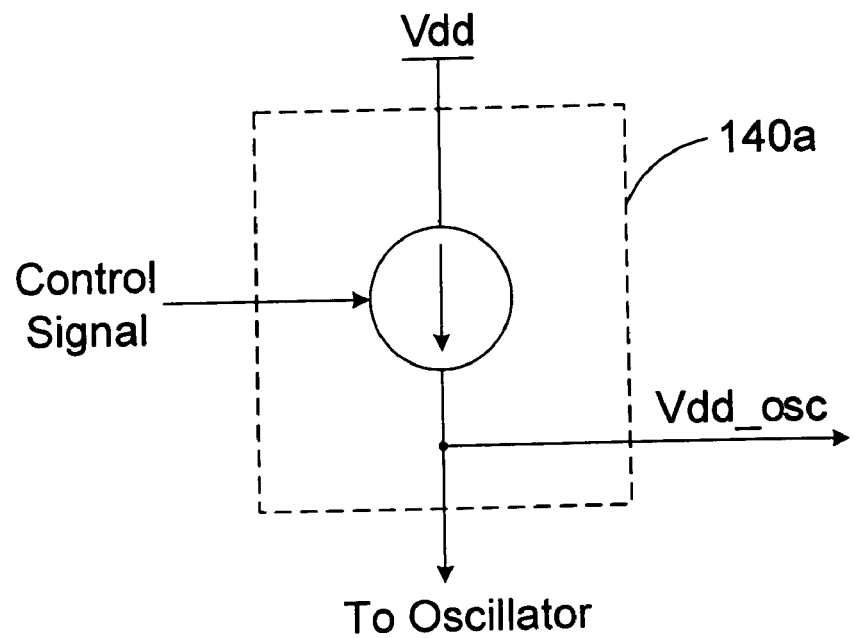
Figure 2B:
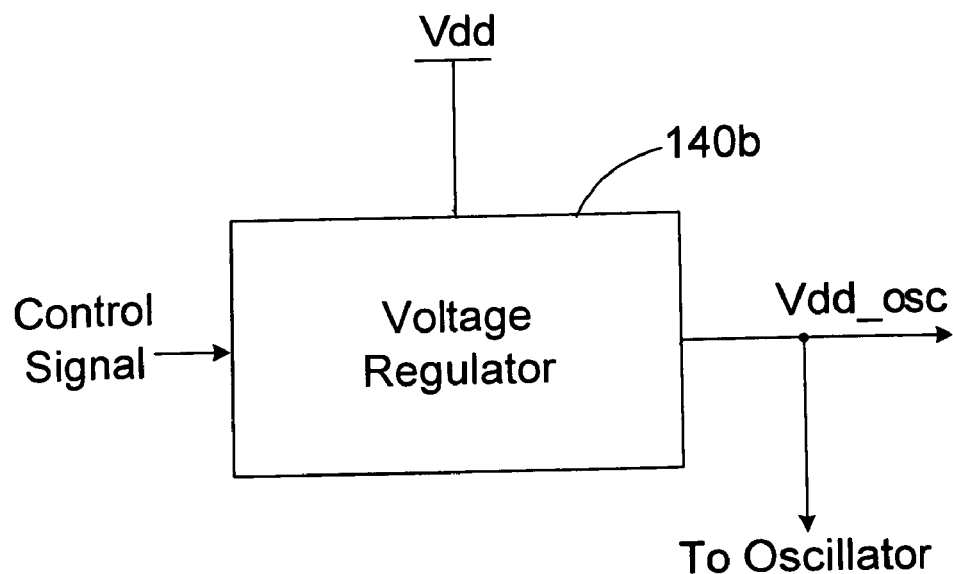
Figure 3:
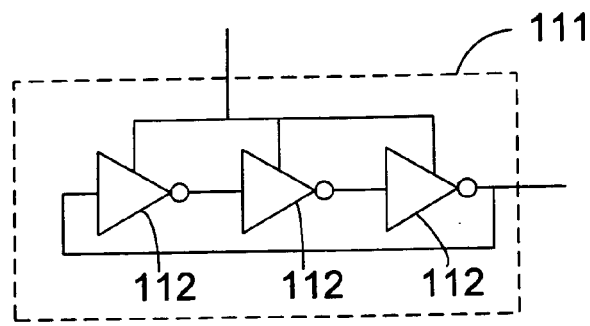
FIG. 3 illustrates an example of the oscillator for use in the circuit of FIG. 1.
Figure 5:
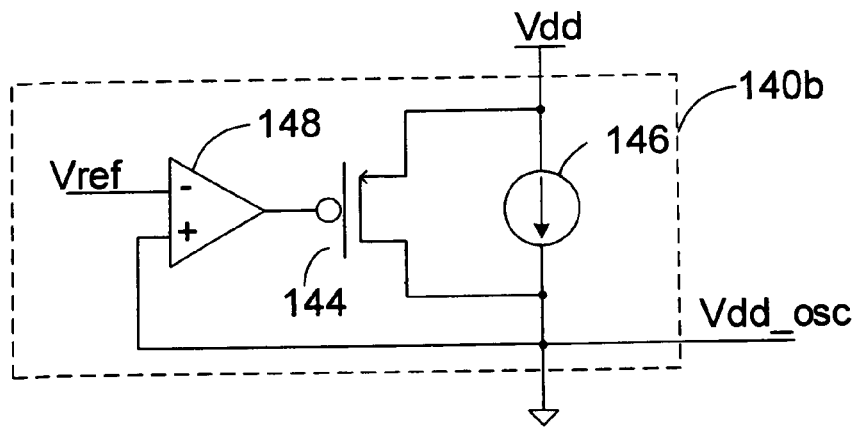
FIG. 5 illustrates an example of the voltage control circuit in FIG. 2(b), where the DC current provides a minimum oscillation frequency to prevent system lockup.

As shown in FIG. 1, the clock generating circuit 110 consists of a voltage-controlled or current-controlled oscillator 111, which is driven by a voltage/current control circuit 140. A control signal 142 controls the voltage/current control circuit 140 to produce a driving voltage/current to the oscillator 111 for generating a clock signal of a predetermined operating frequency. This can be achieved by various conventional techniques, such as a PLL (phase-locked loop) circuit. FIGS. 2(a) and 2(b) illustrate examples of the voltage/current control circuit for oscillator. In FIG. 2(a), a controlled current source 140a is employed to produce a current for powering the oscillator 111, which varies based on process/temperature so that the oscillation frequency is always controlled at a desired frequency. In FIG. 2(b), a controlled voltage regulator 140b is employed to generate a voltage for powering the oscillator, which also varies based on process/temperature and is the minimum stable voltage for the oscillator 111 to generate a desired oscillation frequency. The voltage regulator 140b may be implemented by using any conventional voltage regulating circuits for voltage-controlled oscillators, one example of which is shown in FIG. 5. The voltage regulator 140b is mainly composed of an error amplifier 148, a PMOS transistor 144 and a current source 146. The error amplifier 148 compares a reference voltage Vref at the inverting input terminal and the feedback signal Vdd_osc at the non-inverting input terminal and accordingly generates a voltage signal to control the PMOS transistor 144. The PMOS transistor 144 then passes suitable amount of current for obtaining a suitable voltage Vdd_osc. A current source 146 is connected between the drain and the source of the PMOS transistor 144 to prevent system lockup. The provision of the current source 146 guarantees that the current fed into the oscillator 111 is always large enough to induce an oscillation even when the reference voltage Vref is set to a very low level. A typical example of the oscillator 111 is a ring oscillator with a structure shown in FIG. 3. The core of the ring oscillator 110 is a delay circuit composed of a plurality of delay elements 112 connected in series with the output of the last element connected to the input of the first element to form a feedback loop. A CMOS inverter, for example, may be used as the delay element 112. However, not all of the delay elements in an oscillator must be inverting elements, and the structure in FIG. 3 should be considered as illustrative, not restrictive.

The logic circuit 120 consists of a plurality of logic elements, forming a digital circuit for performing desired functions, and is provided with a power supply terminal to receive a regulated voltage for powering those logic elements, a clock input terminal connected with the clock generating circuit 110 to receive the clock signal of a predetermined frequency. The oscillator 111 in the clock generating circuit 110 and the logic circuit 120 are designed to have the same or similar delay characteristics; that is, the delay elements in the oscillator 111 and the logic elements in the logic circuit 120 have the same or similar sensitivity to supply voltage, temperature and process shifts. Further, in the logic system 100, the period of the clock signal from the oscillator 111 must be equal to or longer than the critical path delay of the logic circuit 120 to ensure correct function of the logic circuit 120. In the preferred embodiment of the invention, the period of the clock signal from the oscillator 111 is designed slightly longer than the critical path delay of the logic circuit 120 for safe operating margin under all conditions. In this embodiment, the period of the clock signal is determined by twice the loop delay of the oscillator 111.

Figure 4:
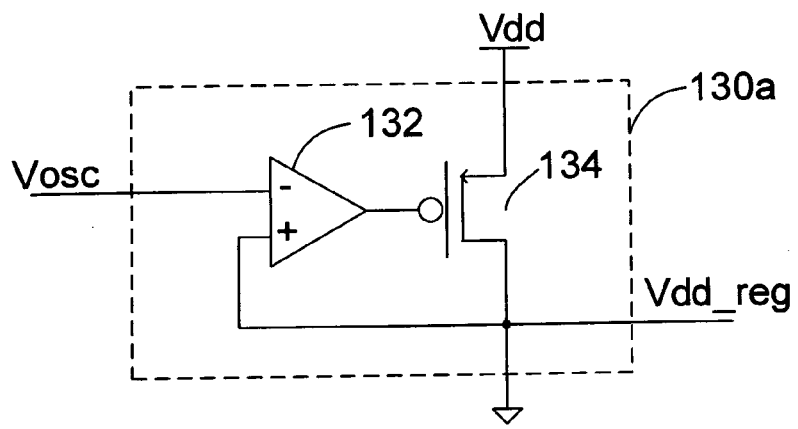
FIG. 4 illustrates a simple example of the voltage conversion circuit for use in the circuit of FIG. 1.

The voltage conversion circuit 130 has an input terminal for connection to the original power supply voltage Vdd for the whole system, an output terminal for connection to the power supply terminal of the logic circuit 120, and a reference voltage terminal for connection to the bias voltage terminal of the oscillator 111. The voltage conversion circuit 130 may be implemented by using any suitable one of known voltage regulating or DC-DC converting circuits. A simple example of the voltage conversion circuit 130 is a linear voltage regulator 130a as illustrated in FIG. 4. As shown, the linear voltage regulator 130a mainly consists of an error amplifier 132 and a PMOS transistor 134. The PMOS transistor 134 has a source electrode used as an input terminal for connection to the original power supply voltage Vdd of the logic system and a drain electrode used as an output terminal. The voltage at the drain of the PMOS transistor 134 feeds back to a non-inverting input of the error amplifier 132, and an inverting input of the error amplifier 132 is used as a reference voltage terminal, which is fed by the bias voltage Vdd_osc of the oscillator 111. With this arrangement, the error amplifier 132 outputs a voltage signal to drive the PMOS transistor 134 according to the difference between the two input signals, and then a regulated voltage Vdd_reg for powering logic circuit 120 can be obtained at the drain of the PMOS transistor 134. More specifically, when the voltage Vdd_reg is higher than the voltage Vdd_osc, the voltage signal at the output of the error amplifier 132 increases and the voltage at the drain of the PMOS transistor 134 is thus lowered. With this arrangement, the bias voltage Vdd_osc of the oscillator 111 can be used as a reference voltage for the voltage regulator 130a, which determines the regulated voltage Vdd_reg at the power supply voltage terminal of the logic circuit 120. The aforementioned voltage regulation technique shows one linear regulator, which dissipates power to regulate voltage. In the optimum embodiment, an efficient DC-DC converter is used to regulate the voltage, reducing the wasted power caused by the simpler linear regulator.

As described above, the oscillator 111 powered by a controlled current or a controlled voltage is always controlled at a desired oscillation frequency. When there is temperature and/or process variations, the controlled current and the bias voltage Vdd_osc of the oscillator 111 will change in order to keep the frequency constant. Since, in the invention, the oscillator 111 and the logic circuit 120 are respectively formed by delay elements and logic elements having the same or similar delay characteristics in regards to supply voltage, temperature, and process shifts and the period of the clock signal from the oscillator 111 is designed slightly longer than the critical path delay of the logic circuit 120, if the supply voltage Vdd_reg of the logic circuit 120 is dynamically regulated by the voltage conversion circuit 130 in response to the change of the oscillator bias voltage Vdd_osc to satisfy the condition Vdd_reg≧Vdd_osc, then the logic circuit 120 can be ensured faster than the oscillator 111. In this way, supply voltage Vdd_reg of the logic circuit 120 can be lowered in most conditions to reduce power dissipation. In the preferred embodiment, the supply voltage Vdd_reg of the logic circuit 120 is dynamically regulated by the voltage conversion circuit 130 to be equal to the bias voltage Vdd_osc of the oscillator 111, so that the supply voltage of the logic circuit 120 is always maintained at a minimum level required for operation. Minimization of the power consumption is thus achieved while the logic circuit 120 is ensured to function correctly without affections by the temperature and process shifts.

Although the clock generating circuit 110 in FIG. 1 is shown to be an internal clock source, in other embodiments the clock signal for clocking the logic circuit 120 can also be provided from an external clock source.

Figure 6:
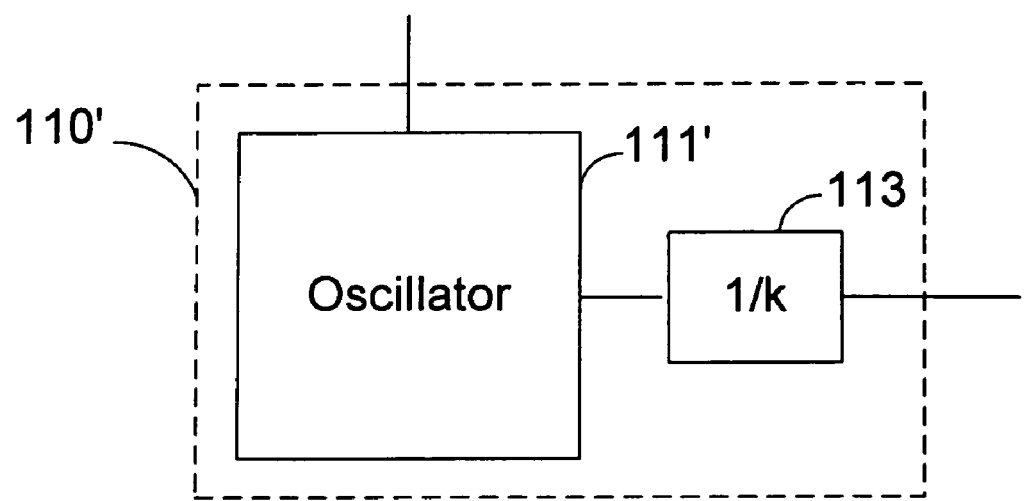
FIG. 6 illustrate a clock generating circuit with a divider connected to the output of the oscillator for use in another preferred embodiment of the logic system with adaptive supply voltage control according to the present invention.

Alternatively, in another preferred embodiment of the invention, the clock generating circuit 110 in the logic system 100 of FIG. 1 can be substituted by a clock generating circuit 110' shown in FIG. 6. The clock generating circuit 110' includes a divide-by-k divider 113 in addition to an oscillator 111'. The divider 113 is connected between the output of the oscillator 111' and the clock input terminal of the logic circuit 120. In this way, the output of the oscillator 111' can be divided before the logic circuit 120 to achieve similar effect as making the period of the clock signal from the clock generating circuit 110' longer. In this embodiment, the period of the clock signal is determined by twice the loop delay of the oscillator 111' times k, and therefore the loop delay of the oscillator 111' and the critical path delay of the logic circuit 120 must satisfy the following condition to ensure correct function of the logic circuit 120:

2×Loop Delay×k≧Critical Path Delay.

As can be seen from the above, the minimization of power consumption is achieved by lowering the supply voltage Vdd_reg for the logic circuit 120 at the time when the circuit speed becomes faster than required. That is, the voltage conversion circuit 130 regulates the supply voltage Vdd_reg to diminish the difference between the critical path delay of the logic circuit 120 and the period of the clock signal from the generating circuit 110 or 110'. The critical path delay of the logic circuit 120 is preferably slightly shorter than the period of the clock signal from the generating circuit 110 or 110' so that the logic circuit 120 is kept slightly faster than the clock generating circuit 110 or 110'.

Figure 8:
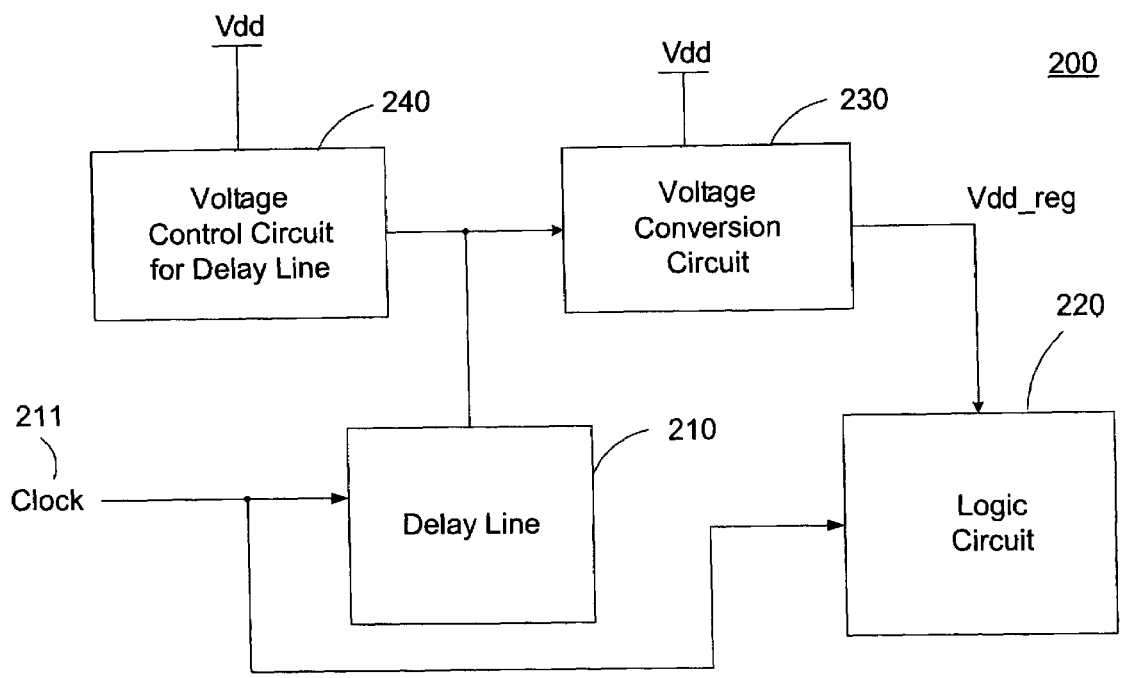
FIG. 8 depicts a schematic circuit diagram of another embodiment according to the present invention, with a delay line and an external clock source.
Figure 9:
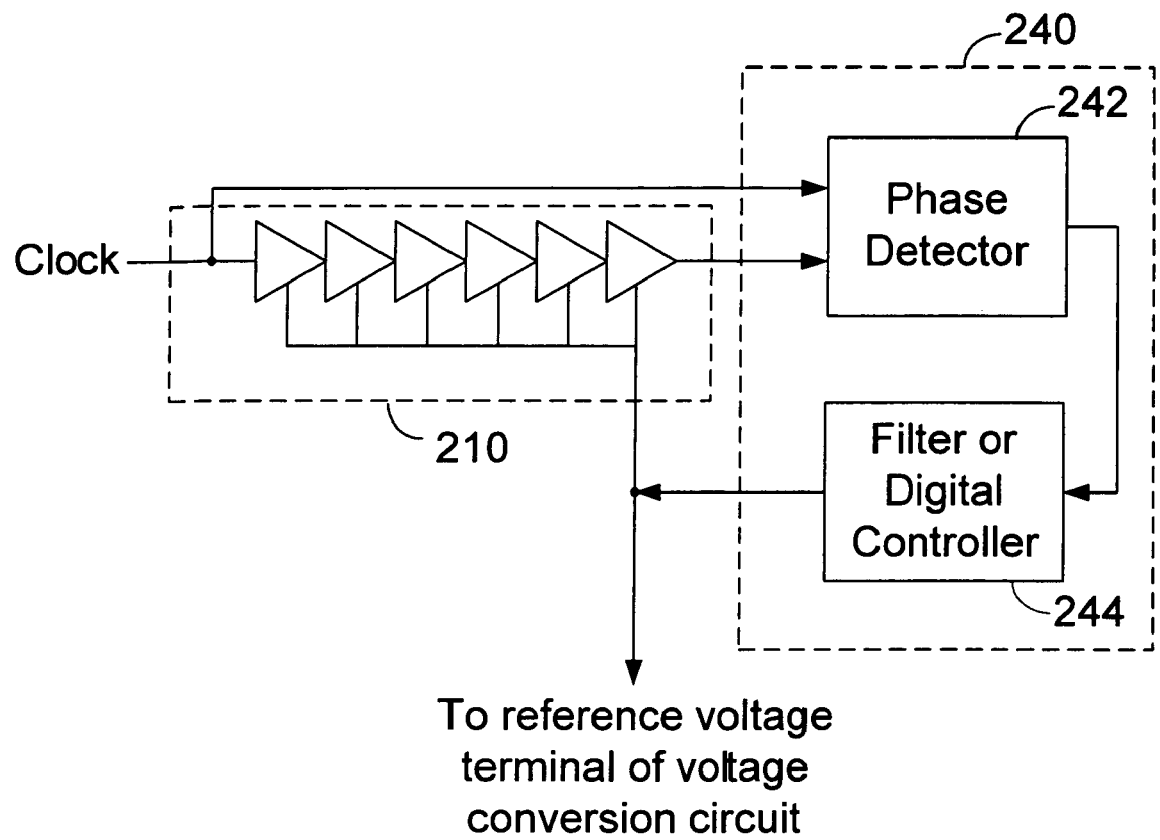
FIG. 9 illustrates an exemplary circuit for carrying out the embodiment of FIG. 8.

In addition to the embodiment in FIG. 1, a DLL (delay-locked loop) circuit or a simple delay reference matching circuit, for example, may also be employed in the delay matching. FIG. 8 shows a schematic circuit diagram of another embodiment with such structure, and FIG. 9 is an exemplary circuit for carrying out the embodiment of FIG. 8. In this embodiment, the clock signal 211 for clocking the logic circuit 220 comes from an external reference. A phase detector 242 compares the phase of a clock signal passing through a delay line 210 with the phase of the original clock signal and outputs a phase error signal to a filter or digital control circuit 244. The filter or digital control circuit 244 accordingly generates a signal for controlling the bias voltage to the delay line 210 so that the two clock signals can be adjusted to be in phase with each other. The bias voltage terminal of the delay line 210 is connected to the reference voltage terminal of the voltage conversion circuit 230, which regulates the supply voltage Vdd_reg for a logic circuit 220 based on the bias voltage of the delay line 210 to thereby minimize power consumption.

Figure 7A:
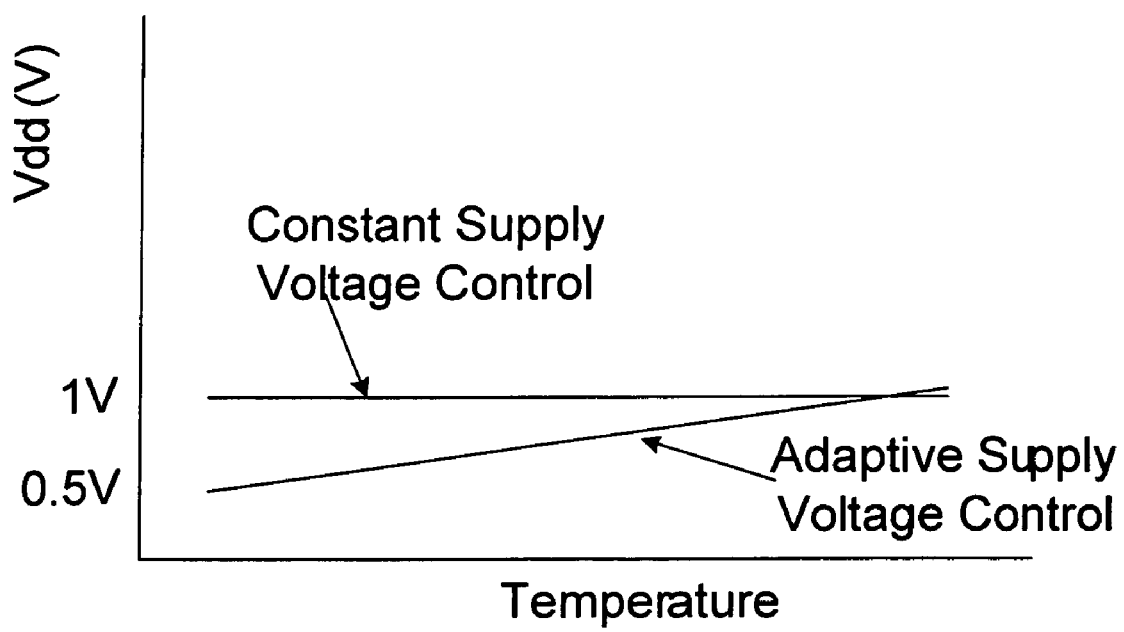
FIG. 7(a) shows a supply voltage to temperature diagram in logic systems respectively with constant supply voltage control and adaptive supply voltage control.
Figure 7B:
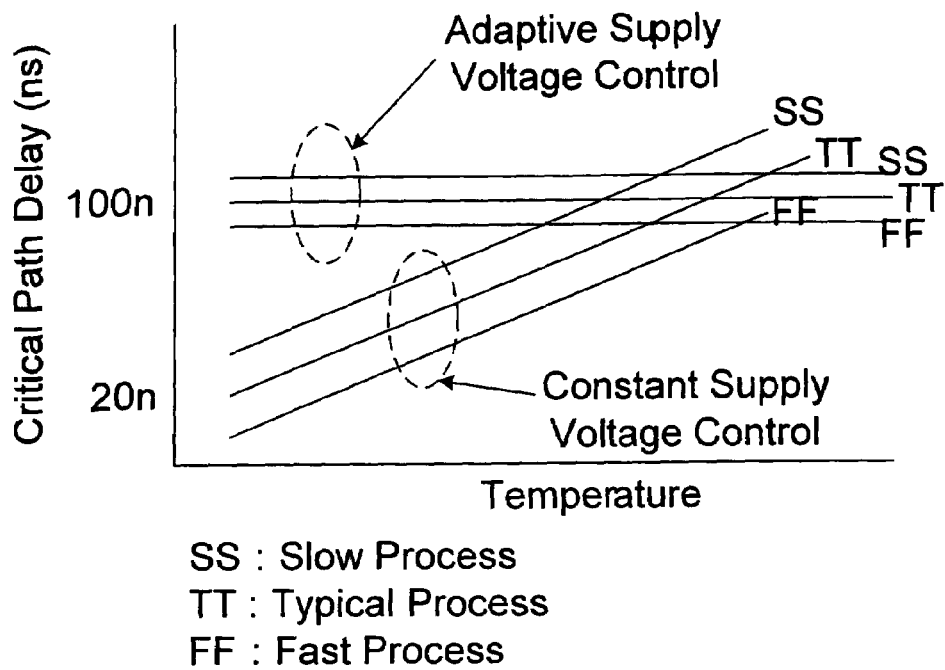
FIG. 7(b) shows a critical path delay to temperature diagram in logic systems respectively with constant supply voltage control and adaptive supply voltage control.
Figure 7C:
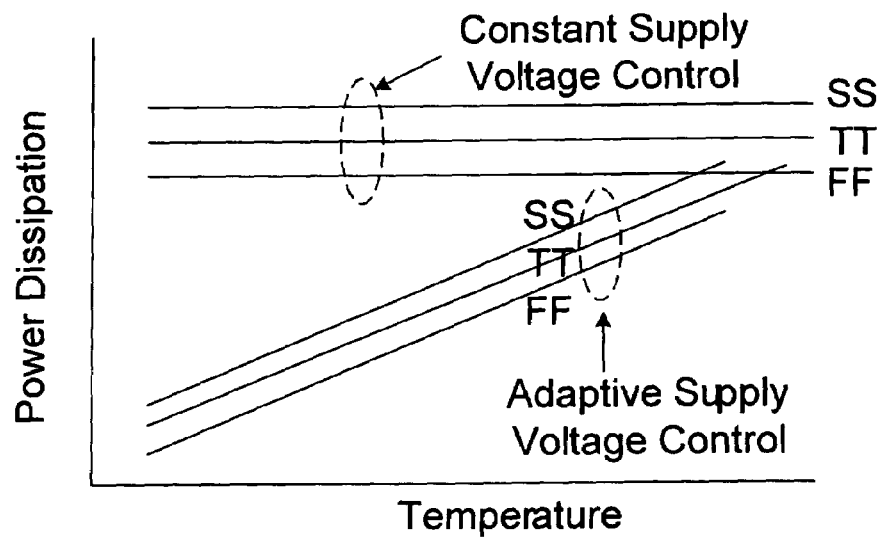
FIG. 7(c) shows a power dissipation to temperature diagram in logic systems respectively with constant supply voltage control and adaptive supply voltage control.

FIGS. 7 (a) to 7(c) show the comparison between conventional constant supply voltage control technology and the present adaptive supply voltage control technology. FIG. 7 (a) shows the supply voltage to temperature diagram. When using constant supply voltage control for a logic circuit, the supply voltage is maintained constant over temperature; comparatively, when using adaptive supply voltage control for a logic circuit, the supply voltage can be regulated to a lower value when the temperature decreases. FIG. 7 (b) shows the critical path delay to temperature diagram at different process variations. When using constant supply voltage control for a logic circuit, the critical path delay becomes shorter as the temperature decreases, which means the circuit is too fast than it necessary needs; comparatively, when using adaptive supply voltage control for a logic circuit, the critical path delay is maintained constant over temperature. FIG. 7(c) shows the power dissipation to temperature diagram at different process variations. In the case of constant supply voltage control, the supply voltage is maintained constant, so the power consumption is maintained almost constant; comparatively, in the case of adaptive supply voltage control, the supply voltage of the logic circuit can be dynamically regulated to a lower level as the temperature decreases, so the power consumption is effectively reduced.

While the present invention has been described with reference to the preferred embodiments thereof, it is to be understood that the invention should not be considered as limited thereby. Various modifications and changes could be conceived of by those skilled in the art without departing from the scope of the present invention, which is indicated by the appended claims.

What is claimed is:

1. A logic system with adaptive supply voltage control, comprising:
    a logic circuit clocked by a clock signal of a predetermined frequency generated by a clock generating circuit, said logic circuit having a critical path delay being equal to or shorter than a period of the clock signal; and
    a voltage conversion circuit for dynamically regulating a supply voltage for powering said logic circuit based on a bias voltage of the clock generating circuit.

2. The logic system with adaptive supply voltage control of claim 1, wherein the clock generating circuit comprises an oscillator and wherein the period of the clock signal is equal to two times of a loop delay of the oscillator.

3. The logic system with adaptive supply voltage control of claim 1, wherein the clock generating circuit comprises an oscillator and a divide-by-k divider connected at the output of the oscillator, and wherein the period of the clock signal is equal to 2 times of a loop delay of the oscillator times k.

4. The logic system with adaptive supply voltage control of claim 1, wherein the period of the clock signal is longer than said critical path delay of said logic circuit.

5. The logic system with adaptive supply voltage control of claim 1, wherein the supply voltage for powering said logic circuit is dynamically regulated such that said critical path delay of said logic circuit approximately matches the period of the clock signal.

6. The logic system with adaptive supply voltage control of claim 1, wherein said voltage conversion circuit comprises a voltage regulator.

7. The logic system with adaptive supply voltage control of claim 1, wherein said voltage conversion circuit comprises a DC-DC converter.

8. The logic system with adaptive supply voltage control of claim 1, wherein a delay matching circuit is employed to achieve matching between said critical path delay of said logic circuit and the period of the clock signal.

9. The logic system with adaptive supply voltage control of claim 1, wherein a DLL (delay-locked loop) circuit is employed to achieve matching between said critical path delay of said logic circuit and the period of the clock signal.

10. A logic system with adaptive supply voltage control, comprising:
a logic circuit having a power supply terminal for receiving a supply voltage and a clock input terminal for receiving a clock signal of a predetermined frequency from a clock generating circuit, said logic circuit having similar delay characteristics with the clock generating circuit; and
a voltage conversion circuit for dynamically regulating the supply voltage at said power supply terminal of said logic circuit on the basis of a bias voltage of the clock generating circuit.

11. The logic system with adaptive supply voltage control of claim 10, wherein the clock generating circuit comprises an oscillator and wherein a period of the clock signal is equal to two times of a loop delay of the oscillator.

12. The logic system with adaptive supply voltage control of claim 10, wherein the clock generating circuit comprises an oscillator and a divide-by-k divider connected at the output of the oscillator, and wherein a period of the clock generating circuit is equal to two times of a loop delay of the oscillator times k.

13. The logic system with adaptive supply voltage control of claim 10, wherein a period of the clock signal is slightly longer than a critical path delay of said logic circuit.

14. The logic system with adaptive supply voltage control of claim 10, wherein the regulated supply voltage at said power supply terminal of said logic circuit is higher than the bias voltage of the clock generating circuit.

15. The logic system with adaptive supply voltage control of claim 10, wherein the regulated supply voltage at said power supply terminal of said logic circuit is equal to the bias voltage of the clock generating circuit.

16. The logic system with adaptive supply voltage control of claim 10, wherein said voltage conversion circuit comprises a voltage regulator.

17. The logic system with adaptive supply voltage control of claim 10, wherein said voltage conversion circuit comprises a DC-DC converter.

18. The logic system with adaptive supply voltage control of claim 10, wherein logic elements constituting said logic circuit have similar delay sensitivity to supply voltage, temperature and process shifts with delay elements in the clock generating circuit.

19. An adaptive supply voltage control method for a logic circuit clocked by a clock signal of a predetermined frequency from a clock generating circuit, said logic circuit having a critical path delay being equal to or shorter than a period of the clock signal, said method comprising dynamically regulating a supply voltage for powering said logic circuit based on a bias voltage of the clock generating circuit.

20. The adaptive supply voltage control method of claim 19, wherein the supply voltage for powering said logic circuit is dynamically regulated such that said critical path delay of said logic circuit approximately matches the period of the clock signal.

21. An adaptive supply voltage control method for a logic circuit clocked by a clock signal of a predetermined frequency from a clock generating circuit, said logic circuit having similar delay characteristics with the clock generating circuit, said method comprising dynamically regulating a supply voltage for said logic circuit on the basis of a bias voltage of the clock generating circuit.

22. The adaptive supply voltage control method of claim 21, wherein a period of the clock signal is longer than a critical path delay of said logic circuit.

23. The adaptive supply voltage control method of claim 21, wherein the regulated supply voltage for said logic circuit is equal to or higher than the bias voltage of the clock generating circuit.

* * * * *